United States Patent [19]

Jacques et al.

[11] Patent Number: 5,450,286

[45] Date of Patent: Sep. 12, 1995

[54] PRINTED CIRCUIT HAVING A DIELECTRIC COVERCOAT

[75] Inventors: Roland C. Jacques, Lowell, Mass.; Robert D. Cyr, Manchester, N.H.

[73] Assignee: Parlex Corporation, Methuen, Mass.

[21] Appl. No.: 268,670

[22] Filed: Jun. 30, 1994

Related U.S. Application Data

[63] Continuation of Ser. No. 986,438, Dec. 4, 1992, abandoned.

[51] Int. Cl.⁶ ............................................. H05K 1/00
[52] U.S. Cl. ...................................... 361/749; 361/748; 361/792; 361/813; 439/67; 428/209; 29/843; 264/272.11; 174/254
[58] Field of Search .............. 257/791; 29/840–843; 264/272.11; 361/736, 748, 749, 750, 751, 760–762, 765, 771, 792, 807, 813; 174/254, 255; 439/67, 77; 428/209

[56] References Cited

U.S. PATENT DOCUMENTS

| | | | |
|---|---|---|---|
| 3,909,680 | 9/1975 | Tsunashima | 317/101 C |
| 4,413,308 | 11/1983 | Brown | 361/398 |
| 4,520,382 | 5/1985 | Shimura | 357/53 |
| 4,829,353 | 5/1989 | Tei | 357/30 |
| 4,988,403 | 1/1991 | Matuo | 156/643 |
| 4,994,316 | 2/1991 | Brome et al. | 428/209 |
| 5,111,363 | 5/1992 | Yagi et al. | 361/398 |
| 5,153,051 | 10/1992 | Dorinski | 428/209 |

FOREIGN PATENT DOCUMENTS

3515985  11/1986  Denmark ............................ 361/397

OTHER PUBLICATIONS

IBM Technical Disclosure Bulletin, Smith and Zipay, Lamination on Contoured Surfaces, Sep. 1971, vol. 14, No. 4, p. 1313.

*Primary Examiner*—Leo P. Picard
*Assistant Examiner*—Young Whang
*Attorney, Agent, or Firm*—Weingarten, Schurgin, Gagnebin & Hayes

[57] ABSTRACT

A printed circuit assembly includes a rigidizer having first and second opposing surfaces, a silicone bonding agent disposed over a first surface of the rigidizer, a flex circuit having first and second opposing surfaces with a first surface of the flex circuit disposed over the bonding agent, and a silicone covercoat disposed over selected portions of the second surface of the flex circuit.

11 Claims, 1 Drawing Sheet

PRINTED CIRCUIT HAVING A DIELECTRIC COVERCOAT

This application is a continuation of application Ser. No. 07/986,438 filed Dec. 4, 1992 now abandoned.

FIELD OF THE INVENTION

This invention relates to printed circuit covercoats and more particularly to silicone covercoats for printed circuits.

BACKGROUND OF THE INVENTION

As is known in the art, dielectric covercoats have been used to cover exposed conductors on a surface of a printed circuit board. The mask will confine the flow of solder to terminal and pad areas thus avoiding so-called solder bridging between pads and circuit lines, for example. Dielectric covercoats improve circuit performance and reliability by retarding electromigration and other forms of growth which may develop on conductors.

As is also known, conventional covercoats are typically provided from adhesive/polyimide or epoxy based soldermask materials. Adhesive coated polyimide covercoats have been used in the past but are expensive to process. For example, an adhesive coated polyimide sheet must have openings drilled and punched therein, and must then be aligned and thermally bonded over the exposed conductors of the circuit. Epoxy soldermasks lack flexibility and fail to provide optimum performance characteristics. Furthermore, conventional epoxy based solder masks tend to fracture when used in flex type circuits when the flex circuit is flexed.

Furthermore, when sheet adhesive systems are used to bond the circuit to a thermal plane, for example, the processing steps include heating, and applying pressure to provide a satisfactory bond between the flex circuit and the thermal plane.

Other materials such as liquid polyimide and urethane for example, have in the past been proposed for use as soldermasks. These materials however have adverse effects on the printed circuits, require increased processing complexity, are difficult to apply, require high temperature curing and are expensive.

The use of silicone covercoats have in the past been specifically avoided in printed circuit applications due to outgassing of the silicone. Silicone by-products contaminate the exposed surfaces of the circuit and degrade adhesion and solderability. Thus, silicone has generally not been considered useful as a covercoat or even an adhesive in printed circuit applications.

It would, however, be desirable to provide a printed circuit assembly having a compliant covercoat which may be easily disposed over the printed circuit and which may provide the printed circuit having low moisture absorption properties.

SUMMARY OF THE INVENTION

In accordance with the present invention, a printed circuit assembly includes a rigidizer having first and second opposing surfaces, a silicone bonding agent disposed over a first surface of the rigidizer, a printed circuit having first and second opposing surfaces, with a first surface of the printed circuit disposed over the bonding agent, and a silicone covercoat disposed over selected portions of the second surface of the printed circuit. The printed circuit may be provided as a flex printed circuit and the silicone dielectric covercoat may be disposed over the second surface of the printed circuit by first cleansing the printed circuit and screening the silicone over selected portions of the second surface of the printed circuit. Thus, fewer processing steps are needed to provide the printed circuit having a silicone dielectric covercoat and consequently there is a concomitant reduction in the processing time and the cost of manufacturing the printed circuit assembly. Furthermore, the silicone covercoat provides a compliant layer for decoupling expansion forces in the printed circuit and attached components, and thus the silicone covercoat is provided having fewer defects due to flexing of the circuit board. The silicone covercoat also minimizes the amount of moisture absorbed into the covercoat and the protected regions of the printed circuit, minimizes the occurrences of corona discharge and remains resilient even at extreme temperatures. Such silicone covercoats may of course be applied to rigid circuit boards, flex circuit boards and rigid-flex printed circuit boards.

BRIEF DESCRIPTION OF THE DRAWINGS

The foregoing features of this invention as well as the invention itself may be more fully understood from the following detailed description of the invention in conjunction with the drawings in which.

DESCRIPTION OF THE PREFERRED EMBODIMENTS

Figure 1:
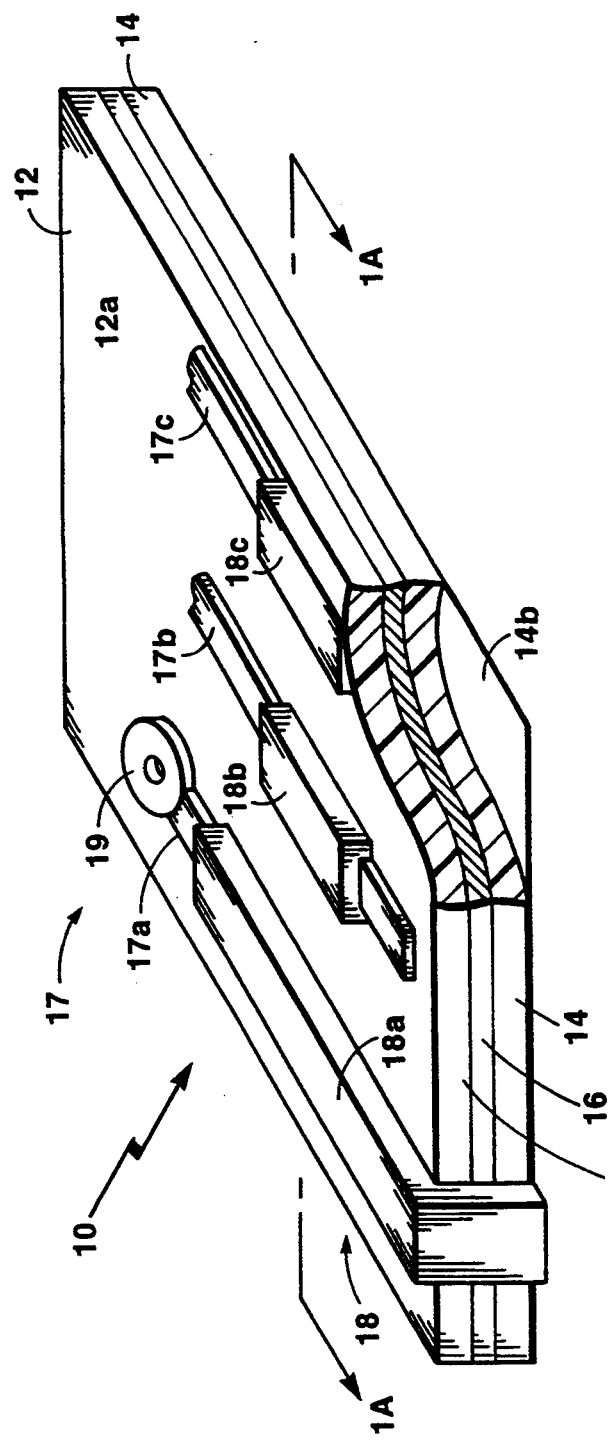
FIG. 1 is a diagrammatical perspective view of a circuit having a silicone covercoat disposed over selected regions of a first surface thereof.
Figure 1A:
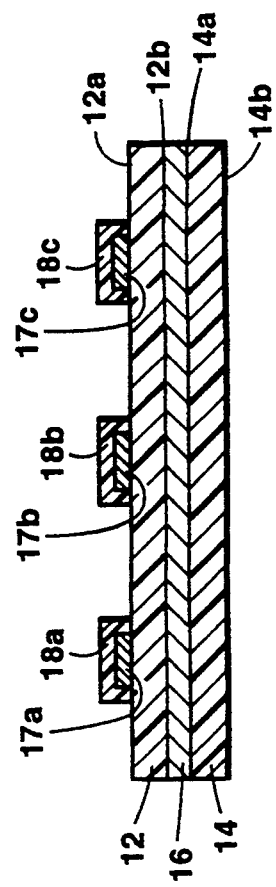
FIG. 1A is a cross sectional view along lines 1A—1A of the circuit of FIG. 1.

Referring now to FIGS. 1 and 1A, a printed circuit assembly 10 includes a flex circuit 12 having first and second opposing surfaces 12a, 12b. A plurality of strip conductors 17a–17c generally denoted 17 are disposed over the first surface 12a of the circuit. The strip conductors may be disposed over the surface 12a using etching techniques, deposition techniques or other techniques well known to those of ordinary skill in the art.

Portions of the flex circuit are here removed to reveal a rigidizer 14 having first and second opposing surfaces 14a, 14b over which the flex circuit 12 is disposed. The rigidizer 14 may be provided from copper, aluminum, ceramic or any other material having desired electrical and thermal characteristics and capable of forming the printed circuit assembly 10 as a rigid printed circuit structure.

The surface 12b of the flex circuit 12 is bonded via a silicone bonding agent 16 to the surface 14a of the rigidizer 14. Over the top surface 12a of the circuit 12 is disposed, on selected predetermine regions of the printed circuit board surface 12a, a silicone covercoat 18. Here, the silicone covercoat is deposited over portions of the strip conductors 17. By way of example only, the first strip conductor 17a has at a first end thereof a solder pad 19. The silicone covercoat is here disposed over the strip conductor 17c while leaving exposed the solder pad 19. Thus, portions of the strip conductor are protected from external materials such as solder or electrical conductors which contact the top surface of the circuit 12a while a desired electrical connection may be made to the solder pad 19.

The printed circuit assembly 10 is here shown with the rigidizer 14 disposed about the entire flex circuit 12. In another embodiment however, the printed circuit assembly 10 may be provided as the type having both flex and rigid portions as described in U.S. patent application Ser. No. 07/511,240 assigned to the assignee of the present invention and incorporated herein by reference.

The process steps in applying the silicone as a covercoat will now be described. Before applying the silicone to the surface 12a of the printed circuit 12, the circuit 12 is preferably prepared by cleaning to provide the circuit 12 having clean oxide free conductors 17. The conductors 17 on sheets of flex circuits, for example, may preferably be cleaned by chemically micro etching the surface of the conductors 17 using a micro-etch sodium persulfate process.

When applied as a covercoat over the first surface 12a of the circuit, the silicone is screened onto the surface of the circuit to a thickness typically of about 0.002 inch. Conventional screening stencils and techniques may be used to process the silicone.

To selectively deposit the silicone over predetermined portions of the first surface of the printed circuit, an image stencil is used to mask selected portions of the circuit and thus allow the silicone to be disposed in predetermined areas of the circuit. In one embodiment the image stencil is provided having a 105 polyester mesh, and a corresponding metal frame. Other materials and mesh sizes may of course also be used.

The screening process preferably includes the step of squeegeeing the silicone through the stencil to selectively deposit the silicone over predetermined portions of the conductors. The conductive lands or pads which are to be tinned, however, may preferably masked and thus the silicon is not deposited in those regions of the circuit board. Thus, the purpose of the stencil is to mask those areas to later be solder coated in the course of subsequent soldering operations.

A screen printer may be used to apply the silicone over the exposed conductors which may be for example etched or deposited strip conductors. The screen printer may be, for example, a manually operated, a semi-automatic or a fully automatic printing machine.

The silicone may then be cured using a curing process may be similar to a thermal curing process used for a soldermask. For example, the silicone covercoat 18 may be cured in a conventional tunnel oven or rack oven. The mask may be cured at a temperature of 150 degrees centigrade for a time in the range of 15–30 minutes after which the mask becomes insoluble.

When the silicone is applied to act as a bonding agent to bond the flex circuit 12 to the rigidizer 14, the silicone 18 is screened to a thickness typically of about 0.002 inch and de-aired with a precision roller. The rolling process, however, does not substantially change the thickness of the applied silicone.

Thus, the silicone adhesive may be applied as both an adhesive and as a dielectric insulation or covercoat over a printed circuit board to cover exposed conductors. This is particularly advantageous since the number of different materials which must be used during the fabrication process of a printed circuit assembly are thus reduced.

The silicone may also be applied to each side of a flexible printed circuit as well as in those areas not to be tinned in the course of subsequent soldering processes. Furthermore, the silicone covercoat may be applied to rigid circuit boards as well as flex circuit boards.

The silicone rubber adhesive may be provided, for example, as a two component system of the type manufactured by General Electric Corporation and identified as part numbers GE exp 2962-014A and GE exp 2962-014B components. The two silicone components may be mixed using a two-component transfer system and a static mixer assembly. Due to the high viscosity of the silicone a 30 element static mixer or equivalent may be required to ensure adequate mixing of the silicone. Alternatively, the silicone may be provided as a premixed material having part number GE exp 2892-014.

Having described preferred embodiments of the invention, it will now become apparent to one of skill in the art that other embodiments incorporating the concepts may be used. It is felt, therefore, that these embodiments should not be limited to disclosed embodiments but rather should be limited only by the spirit and scope of the appended claims.

What is claimed is:

1. A printed circuit assembly comprising:
    a rigidizer having first and second opposing surfaces;
    a silicone bonding agent disposed over a first surface of the rigidizer;
    a flex circuit having a first surface and a second opposing surface with the first surface of said flex circuit disposed over said silicone bonding agent; and
    a silicone covercoat disposed over selected portions of the second surface of said flex circuit.

2. The printed circuit assembly of claim 1 wherein said silicone bonding agent and said silicone covercoat are provided as the same material.

3. The printed circuit assembly of claim 1 wherein said selected portion of the second surface of said flex circuit corresponds to the entire portion of the second surface of said flex circuit.

4. The printed circuit assembly of claim 1 wherein said selected portion of the second surface of said flex circuit corresponds to the those portions of the second surface of said flex circuit having a strip conductor disposed thereon.

5. A printed circuit assembly having a rigid portion and a flex portion comprising:
    a rigidizer having first and second opposing surfaces;
    a silicone bonding agent disposed over a first surface of the rigidizer;
    a flex circuit having a first surface and a second opposing surface with the first surface of said flex circuit disposed over said silicone bonding agent; and
    a silicone covercoat disposed over selected portions of the second surface of said flex circuit in the flex portion of said printed circuit assembly.

6. The printed circuit assembly of claim 5 wherein said silicone bonding agent and said silicone covercoat are provided as the same material.

7. The printed circuit assembly of claim 5 wherein said selected portion of the second surface of said flex circuit corresponds to the entire portion of the second surface of said flex circuit.

8. The printed circuit assembly of claim 5 wherein said selected portion of the second surface of said flex circuit corresponds to the those portions of the second surface of said flex circuit having a strip conductor disposed thereon.

9. A process for applying a dielectric covercoat over exposed conductors on a first surface of a flexible printed circuit board, said process comprising the steps of:

(a) applying a silicone bonding agent to a first surface of a rigidizer;
(b) bonding a second surface of the flexible printed circuit board to the rigidizer;
(c) cleaning the first surface of the flexible printed circuit board;
(d) applying a silicone dielectric covercoat over selected portions of the exposed conductors on the first surface of the printed circuit board; and
(e) curing said silicone dielectric covercoat.

10. The process of claim 9 wherein:
said cleaning step comprises the steps of micro-etching said conductors using a sodium persulfate process; and
said applying step comprises the steps of:
masking predetermined portions of the exposed conductors on the first surface of the printed circuit; and
screening said silicone dielectric over the unmasked portions of first surface of the printed circuit to a thickness typically of about 0.002 inch.

11. The process of claim 10 further comprising the step of mixing the silicone in a two component transfer system wherein said mixing is performed prior to said step of applying the silicone dielectric covercoat and said mixing step is performed by a static mixer.

* * * * *